United States Patent
Wang et al.

(10) Patent No.: US 11,502,114 B2
(45) Date of Patent: Nov. 15, 2022

(54) DISPLAY PANEL

(71) Applicant: Au Optronics Corporation, Hsinchu (TW)

(72) Inventors: Jia-Hong Wang, Hsinchu (TW); Min-Tse Lee, Hsinchu (TW); Sheng-Yen Cheng, Hsinchu (TW); Ping-Wen Chen, Hsinchu (TW); Hung-Chia Liao, Hsinchu (TW); Yueh-Hung Chung, Hsinchu (TW); Ya-Ling Hsu, Hsinchu (TW); Chen-Hsien Liao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 376 days.

(21) Appl. No.: 16/905,935

(22) Filed: Jun. 19, 2020

(65) Prior Publication Data

US 2021/0057449 A1 Feb. 25, 2021

Related U.S. Application Data

(60) Provisional application No. 62/889,181, filed on Aug. 20, 2019.

(30) Foreign Application Priority Data

Mar. 4, 2020 (TW) ................................. 109107073

(51) Int. Cl.
*H01L 27/12* (2006.01)
*G02F 1/1362* (2006.01)
*G02F 1/136* (2006.01)

(52) U.S. Cl.
CPC ...... *H01L 27/124* (2013.01); *G02F 1/136286* (2013.01); *G02F 1/13606* (2021.01)

(58) Field of Classification Search
CPC .......................... H01L 27/124; G02F 1/136286
See application file for complete search history.

(56) References Cited

U.S. PATENT DOCUMENTS

2014/0167052 A1\* 6/2014 Park ...................... H01L 27/124
257/59

FOREIGN PATENT DOCUMENTS

TW 201432535 8/2014
TW 201935445 9/2019

\* cited by examiner

*Primary Examiner* — Shih Tsun A Chou
*Assistant Examiner* — Peter M Albrecht
(74) *Attorney, Agent, or Firm* — JCIPRNET

(57) ABSTRACT

A display panel including sub-pixels, first and second scan lines, first and second data lines, and first to fourth auxiliary lines is provided. The sub-pixels are arranged into first rows arranged in a first direction and second rows arranged in a second direction. Each third auxiliary line is electrically connected to a second auxiliary line and a first auxiliary line electrically connected to a first scan line. Each fourth auxiliary line is electrically connected to a second scan line and a first scan line. There are at least 2n second rows between each third auxiliary line and the first scan line electrically connected thereto, there are at least 2n+1 second rows between each third auxiliary line and the second scan line electrically connected thereto, and n is a positive integer.

20 Claims, 3 Drawing Sheets

DISPLAY PANEL

CROSS-REFERENCE TO RELATED APPLICATION

This application claims the priority benefits of U.S. provisional application Ser. No. 62/889,181, filed on Aug. 20, 2019, and Taiwan application serial no. 109107073, filed on Mar. 4, 2020. The entirety of each of the above-mentioned patent applications is hereby incorporated by reference herein and made a part of this specification.

BACKGROUND OF THE INVENTION

1. Field of the Invention

The invention relates to an electronic device, and in particular, to a display panel.

2. Description of Related Art

In order to meet requirements of various shapes of electronic devices, a display panel needs to connect a horizontal scan line through a vertical auxiliary line to enable a scan signal and a data signal to be input from a same side of the display panel. However, in the case of pre-charging, such a design architecture may cause some sub-pixels to have gray-scale variation due to impact of capacitive coupling, thereby resulting in poor screen performance. For example, when pre-charging is first-order, a switching element in an $(N+1)^{th}$ horizontal row is turned on before a switching element in an $N^{th}$ horizontal row is turned off. If an auxiliary line electrically connected to the $N^{th}$ horizontal row passes through a plurality of sub-pixels in the $(N+1)^{th}$ horizontal row, electric potentials of the plurality of sub-pixels are pulled down when the switching element in the $N^{th}$ horizontal row is turned off, and the electric potentials of the plurality of sub-pixels are pulled down again when the switching element in the $(N+1)^{th}$ horizontal row is turned off. As a result, brightness of the plurality of sub-pixels is different from brightness of other sub-pixels in the $(N+1)^{th}$ horizontal row.

SUMMARY OF THE INVENTION

The invention provides a display panel, to improve influence of capacitive coupling.

An embodiment of the invention provides a display panel, including a plurality of sub-pixels, a plurality of first scan lines, a plurality of second scan lines, a plurality of first data lines, a plurality of second data lines, a plurality of first auxiliary lines, a plurality of second auxiliary lines, a plurality of third auxiliary lines, and a plurality of fourth auxiliary lines. The plurality of sub-pixels are arranged into a plurality of first rows arranged in a first direction and a plurality of second rows arranged in a second direction intersecting the first direction. The plurality of first scan lines and the plurality of second scan lines are alternately arranged in the second direction and are electrically connected to the plurality of second rows, respectively. The plurality of first data lines and the plurality of second data lines are alternately arranged in the first direction. There is one first data line and one second data line between any two adjacent first rows. The plurality of second rows are alternately electrically connected to the plurality of first data lines and the plurality of second data lines. The plurality of first auxiliary lines extend in the second direction, where each of the plurality of first auxiliary lines is electrically connected to one corresponding first scan line. The plurality of second auxiliary lines extend in the second direction, where there is at least one first row between each of the plurality of first auxiliary lines and an adjacent second auxiliary line. Each of the plurality of third auxiliary lines electrically connects one first auxiliary line to one adjacent second auxiliary line. Each of the plurality of fourth auxiliary lines electrically connects one second scan line to one adjacent first scan line. There are at least 2n second rows between each of the plurality of third auxiliary lines and the first scan line electrically connected thereto, and there are at least 2n+1 second rows between each of the plurality of third auxiliary lines and the second scan line electrically connected thereto, n being a positive integer.

To make the features and advantages of the invention clear and easy to understand, the following gives a detailed description of embodiments with reference to accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
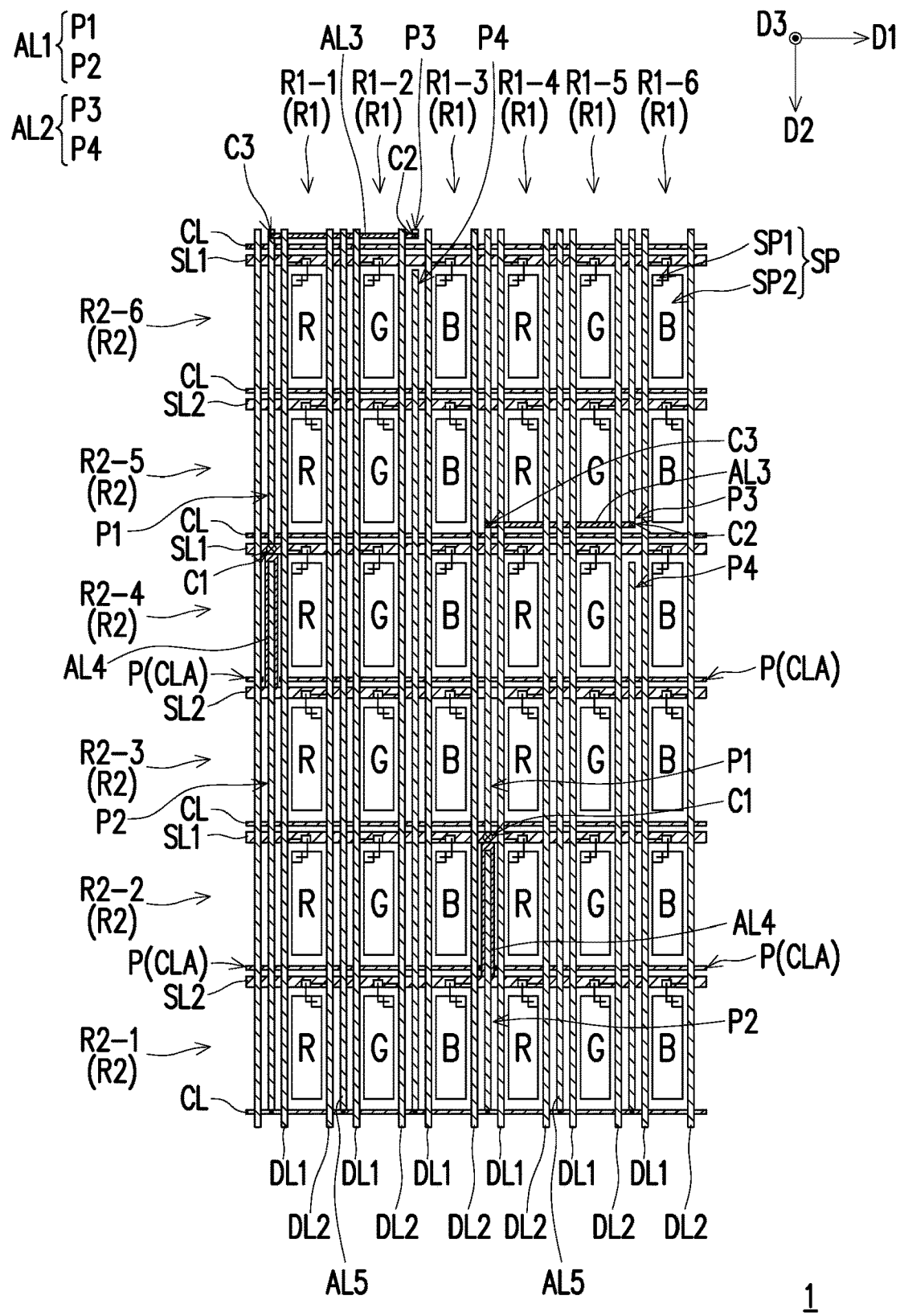
FIG. 1 to FIG. 3 are partial top views of a display panel according to a plurality of embodiments of the invention.

The directional terms mentioned herein, like "above", "below", "front", "back", "left", and "right", refer to the directions in the accompanying drawings. Therefore, the directional terms are only used for illustration instead of limiting the invention.

In the accompanying drawings, common features of a method, a structure or a material used in a specific embodiment are shown in the drawings. However, these drawings should not be construed as defining or limiting the scope or nature of these embodiments. For example, the relative sizes, thicknesses and positions of films, regions and/or structures may be reduced or enlarged for clarity.

In the different embodiments, same or similar reference numerals are used to indicate same or similar elements, and details may be omitted in the description. In addition, features in the different embodiments may be combined with each other provided that there is no conflict, and simple equivalent changes and modifications made to the specification or the claims shall still fall within the scope of the invention.

The terms "first", "second", and the like mentioned in the specification or the claims are used only to name discrete elements or to distinguish between different embodiments or ranges, but are not intended to define the upper or lower limit of the number of elements or the manufacturing or arrangement order of the elements. In addition, one element/film layer being disposed on (or above) another element/film layer may include a case that the element/film layer is directly disposed on (or above) the another element/film layer, and the two elements/film layers are in direct contact; and a case that the element/film layer is indirectly disposed on (or above) the another element/film layer, and there are one or more elements/film layers between the two elements/film layers.

Figure 2:
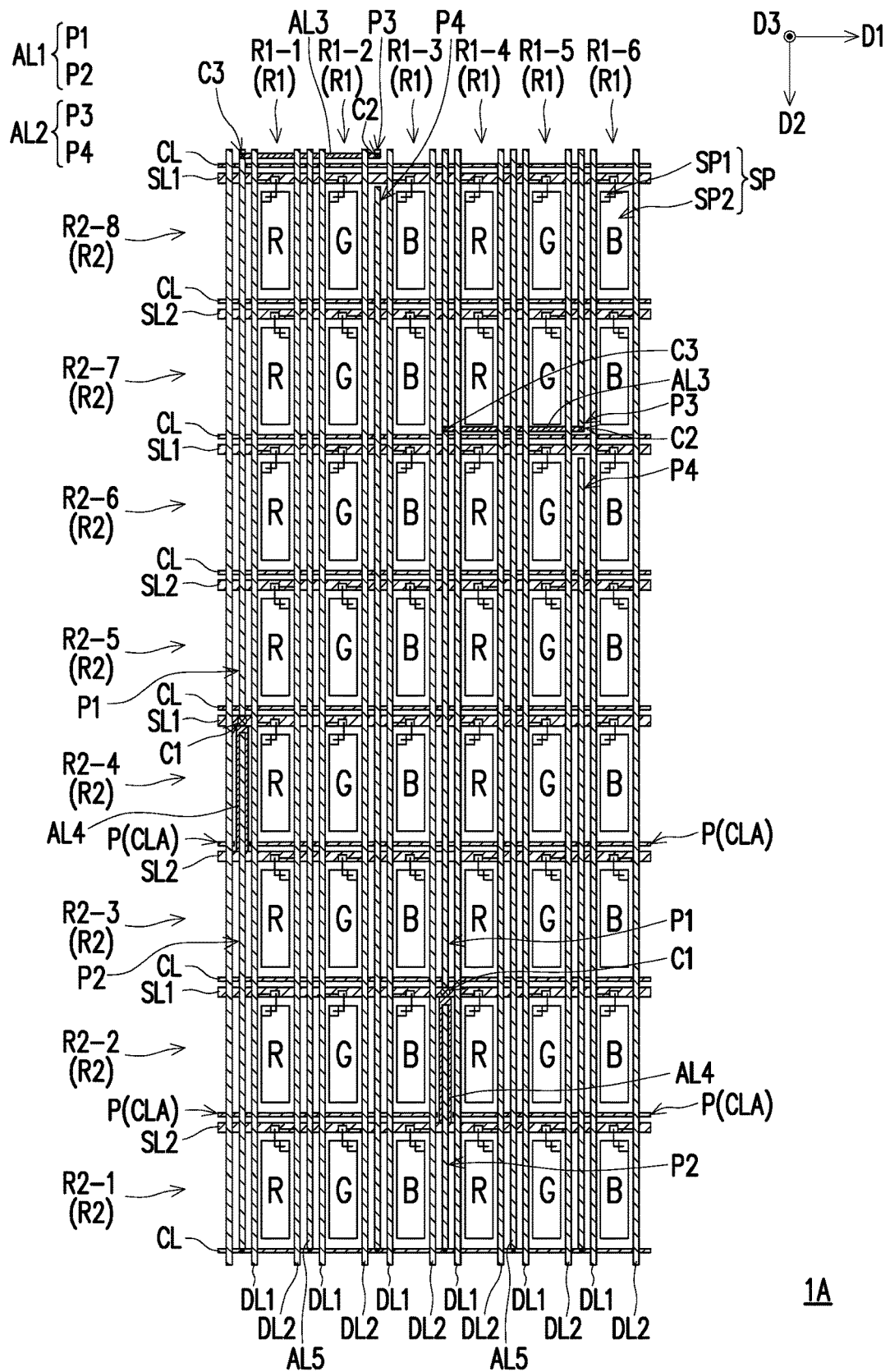
Figure 3:
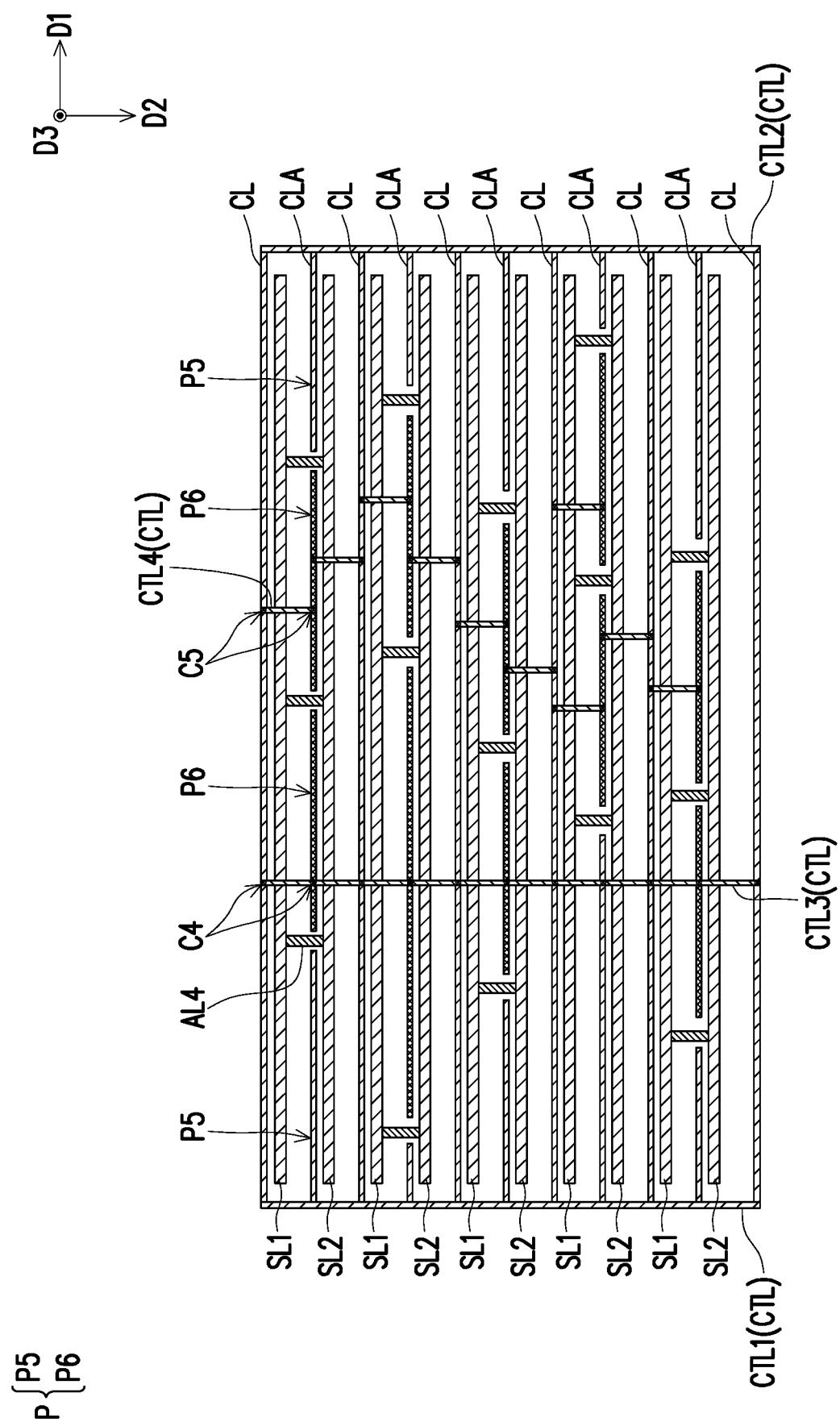

FIG. 1 to FIG. 3 are partial top views of a display panel according to a plurality of embodiments of the invention. For ease of description, FIG. 1 to FIG. 3 only schematically illustrate a partial structure of an active element array substrate of the display panel. However, it should be understood that the active element array substrate of the display panel may include other elements or films in addition to the shown structure. In addition to the active element array substrate, the display panel may include an opposite substrate and a display medium layer between the active element array substrate and the opposite substrate. The display medium layer may include a liquid crystal layer, but is not limited thereto. For the opposite substrate and the display medium layer in the display panel, refer to an existing design. Redundant descriptions are omitted herein.

Referring to FIG. 1, a display panel 1 may include a plurality of sub-pixels SP, a plurality of first scan lines SL1, a plurality of second scan lines SL2, a plurality of first data lines DL1, a plurality of second data lines DL2, a plurality of first auxiliary lines AL1, a plurality of second auxiliary lines AL2, a plurality of third auxiliary lines AL3, and a plurality of fourth auxiliary lines AL4.

The plurality of sub-pixels SP are arranged in an array. The array may include a plurality of first rows R1 arranged in a first direction D1 and a plurality of second rows R2 arranged in a second direction D2. The second direction D2 intersects the first direction D1. As shown in FIG. 1, the second direction D2 may be perpendicular to the first direction D1, but is not limited thereto. FIG. 1 schematically illustrates six first rows R1 (such as a first row R1-1 to a first row R1-6 arranged along the first direction D1) and six second rows R2 (such as a second row R2-1 to a second row R2-6 arranged along an opposite direction of the second direction D2), where each of the six first rows R1 includes six sub-pixels SP arranged at intervals, and each of the six second rows R2 includes six sub-pixels SP arranged at intervals. However, a number of sub-pixels SP in the display panel 1, a number of first rows R1, a number of second rows R2, a number of sub-pixels SP in the first row R1, or a number of sub-pixels SP in the second row R2 or an arrangement manner of a plurality of sub-pixels SP may change as required (such as a shape or a resolution of the display panel). For example, the display panel 1 may further include more first rows R1 or more second rows R2, where these first rows R1 are, for example, arranged along the first direction D1, and these second rows R2 are, for example, arranged along the opposite direction of the second direction D2.

The plurality of sub-pixels SP may include a plurality of red sub-pixels R, a plurality of green sub-pixels G, and a plurality of blue sub-pixels B. In some embodiments, the plurality of sub-pixels SP in each of the six first rows R1 may have a same color, and the plurality of sub-pixels SP in each of the six second rows R2 may include a plurality of red sub-pixels R, a plurality of green sub-pixels G, and a plurality of blue sub-pixels B alternately arranged in the first direction D1. As shown in FIG. 1, the plurality of red sub-pixels R may be arranged into a plurality of red rows extending in the second direction D2, the plurality of green sub-pixels G may be arranged into a plurality of green rows extending in the second direction D2, the plurality of blue sub-pixels B may be arranged into a plurality of blue rows extending in the second direction D2, and the plurality of red rows, the plurality of green rows, and the plurality of blue rows are alternately arranged in the first direction D1. However, color types and arrangement manners of the plurality of sub-pixels SP may change as required.

Each of the plurality of sub-pixels SP may include one or more active elements (also referred to as switching elements) SP1 and one or more pixel electrodes SP2. The active element SP1 may include a gate (not shown), a gate insulating layer (not shown), a semiconductor layer (not shown), an insulating layer (not shown), a source (not shown), and a drain (not shown) electrically connected to the pixel electrode SP2, but is not limited thereto. For a number and a relative disposing relationship of a plurality of elements in the active element SP1, refer to an existing design. Redundant descriptions are omitted herein.

The plurality of first scan lines SL1 and the plurality of second scan lines SL2 are alternately arranged in the second direction D2. As shown in FIG. 1, an even-numbered row (such as the second row R2-6, the second row R2-4, or the second row R2-2) in the plurality of second rows R2 may be located between the first scan line SL1 and the second scan line SL2 sequentially arranged along the second direction D2, and an odd-numbered row (such as the second row R2-5 or the second row R2-3) in the plurality of second rows R2 may be located between the second scan line SL2 and the first scan line SL1 sequentially arranged along the second direction D2.

The plurality of first scan lines SL1 and the plurality of second scan lines SL2 are electrically connected to the plurality of second rows R2, respectively. As shown in FIG. 1, these even-numbered rows (such as the second row R2-6, the second row R2-4, and the second row R2-2) in the plurality of second rows R2 may be electrically connected to the plurality of first scan lines SL1, respectively, these odd-numbered rows (such as the second row R2-5, the second row R2-3, and the second row R2-1) in the plurality of second rows R2 may be electrically connected to the plurality of second scan lines SL2, respectively, and each of the plurality of second rows R2 is electrically connected to one first scan line SL1 or to one second scan line SL2. In this specification, that the second row R2 is electrically connected to a scan line (such as the first scan line SL1 or the second scan line SL2) means that a plurality of gates in the plurality of sub-pixels SP (including the plurality of red sub-pixels R, the plurality of green sub-pixels G, and the plurality of blue sub-pixels B) arranged into the second row R2 are electrically connected to the scan line.

The plurality of first data lines DL1 and the plurality of second data lines DL2 are alternately arranged in the first direction D1. As shown in FIG. 1, each of the plurality of first rows R1 may be located between the first data line DL1 and the second data line DL2 sequentially arranged along the first direction D1, and there may be one first data line DL1 and one second data line DL2 between any two adjacent first rows R1.

The plurality of second rows R2 are alternately electrically connected to the plurality of first data lines DL1 and the plurality of second data lines DL2. As shown in FIG. 1, these even-numbered rows (such as the second row R2-6, the second row R2-4, and the second row R2-2) in the plurality of second rows R2 may be electrically connected to the plurality of first data lines DL1, and these odd-numbered rows (such as the second row R2-5, the second row R2-3, and the second row R2-1) in the plurality of second rows R2 may be electrically connected to the plurality of second data lines DL2. In addition, in each of the plurality of first rows R1, a plurality of even-numbered sub-pixels SP (such as second, fourth, and sixth sub-pixels SP in order from bottom to top in each of the plurality of first rows R1) are electrically connected to one first data line DL1, a plurality of odd-numbered sub-pixels SP (such as first, third, and fifth sub-pixels SP in order from bottom to top in each of the plurality of first rows R1) are electrically connected to one second data line DL2, and the plurality of odd-numbered sub-pixels SP and the plurality of even-numbered sub-pixels SP are located between the one first data line DL1 and the one second data line DL2. In this specification, that the second row R2 is electrically connected to a plurality of data lines (such as the plurality of first data lines DL1 or the plurality of second data lines DL2) means that a plurality of sources in the plurality of sub-pixels SP (including the plurality of red sub-pixels R, the plurality of green sub-pixels G, and the plurality of blue sub-pixels B) arranged into the second row R2 are electrically connected to the plurality of data lines.

At least one of the plurality of first auxiliary lines AL1 is located in the array formed by the plurality of sub-pixels SP. For example, the at least one of the plurality of first auxiliary lines AL1 may be located between two adjacent first rows R1. The plurality of first auxiliary lines AL1 may be disposed in parallel with the plurality of first data lines DL1 and the plurality of second data lines DL2. In some embodiments, the plurality of first auxiliary lines AL1, the plurality of first data lines DL1, and the plurality of second data lines DL2 may belong to a same conductive layer, that is, the plurality of first auxiliary lines AL1 may be disposed on the same layer as the plurality of first data lines DL1 and the plurality of second data lines DL2. The conductive layer may be a metal layer. The metal layer may be a single metal layer or a stacked layer of a plurality of metal layers.

Each of the plurality of first auxiliary lines AL1 extends in the second direction D2, where each of the plurality of first auxiliary lines AL1 is electrically connected to one corresponding first scan line SL1. In some embodiments, each of the plurality of first auxiliary lines AL1 may include a first portion P1 and a second portion P2 arranged in the second direction D2. The first portion P1 is electrically connected to one first scan line SL1. For example, the first portion P1 is connected to a gate signal terminal (not shown) and extends from the gate signal terminal along the second direction D2 to the one first scan line SL1, where an end of the first portion P1 near the one first scan line SL1 may end above the one first scan line SL1 and is electrically connected to the one first scan line SL1 through at least one conductive via C1. The second portion P2 is spaced apart from the first portion P1 and electrically insulated from the first portion P1. For example, the second portion P2 may extend from the end near the first portion P1 along the second direction D2 away from the first portion P1. In some embodiments, the second portion P2 is, for example, connected to a direct current signal terminal (not shown), to provide a voltage stabilizing effect, but is not limited thereto. In some other embodiments, an electric potential of the second portion P2 may be floating.

FIG. 1 schematically illustrates that each of the plurality of first scan lines SL1 is electrically connected to one first auxiliary line AL1. However, in other embodiments, each of the plurality of first scan lines SL1 may be electrically connected to more than one first auxiliary line AL1. A number of first auxiliary lines AL1 electrically connected to each of the plurality of first scan lines SL1 is increased, thereby reducing impedance and improving uniformity of a display screen.

At least one of the plurality of second auxiliary lines AL2 is located in the array formed by the plurality of sub-pixels SP. For example, the at least one of the plurality of second auxiliary lines AL2 may be located between two adjacent first rows R1. The plurality of second auxiliary lines AL2 may be disposed in parallel with the plurality of first data lines DL1 and the plurality of second data lines DL2. In some embodiments, the plurality of first auxiliary lines AL1, the plurality of second auxiliary lines AL2, the plurality of first data lines DL1, and the plurality of second data lines DL2 may belong to a same conductive layer, that is, the plurality of second auxiliary lines AL2 may be disposed on the same layer as the plurality of first auxiliary lines AL1, the plurality of first data lines DL1, and the plurality of second data lines DL2, but are not limited thereto.

In some embodiments, the plurality of second auxiliary lines AL2 and the plurality of first auxiliary lines AL1 may be, for example, alternately arranged in the first direction D1, and there is at least one first row R1 between each of the plurality of first auxiliary lines AL1 and an adjacent second auxiliary line AL2. In this architecture, there are a plurality of first rows R1 between two adjacent first auxiliary lines AL1 and a plurality of first rows R1 between two adjacent second auxiliary lines AL2. FIG. 1 schematically shows that there are two first rows R1 (such as one red row and one green row) between each of the plurality of first auxiliary lines AL1 and an adjacent second auxiliary line AL2. However, an arrangement manner of the plurality of second auxiliary lines AL2 and the plurality of first auxiliary lines AL1 or a number of first rows R1 between each of the plurality of first auxiliary lines AL1 and an adjacent second auxiliary line AL2 may change as required.

The plurality of second auxiliary lines AL2 extend in the second direction D2. In some embodiments, each of the plurality of second auxiliary lines AL2 may include a third portion P3 and a fourth portion P4 arranged in the second direction D2. The third portion P3 is electrically connected to one third auxiliary line AL3. For example, the third portion P3 is connected to a gate signal terminal (not shown) and extends from the gate signal terminal along the second direction D2 to the one third auxiliary line AL3, where an end of the third portion P3 near the one third auxiliary line AL3 may end above the one third auxiliary line AL3 and is electrically connected to the one third auxiliary line AL3 through at least one conductive via C2. The fourth portion P4 is spaced apart from the third portion P3 and electrically insulated from the third portion P3. For example, the fourth portion P4 may extend from the end near the third portion P3 along the second direction D2 away from the third portion P3. In some embodiments, the fourth portion P4 is, for example, connected to a direct current signal terminal (not shown), to provide a voltage stabilizing effect, but is not limited thereto. In some other embodiments, an electric potential of the fourth portion P4 may be floating.

At least one of the plurality of third auxiliary lines AL3 is located in the array formed by the plurality of sub-pixels SP. For example, the at least one of the plurality of third auxiliary lines AL3 may be located between two adjacent second rows R2. The plurality of third auxiliary lines AL3 may be disposed in parallel with the plurality of first scan lines SL1 and the plurality of second scan lines SL2. For example, each of the plurality of third auxiliary lines AL3 may extend in the first direction D1, and each of the plurality of third auxiliary lines AL3 electrically connects one first auxiliary line AL1 to one adjacent second auxiliary line AL2. In particular, for example, each of the plurality of third auxiliary lines AL3 electrically connects a first portion P1 of one first auxiliary line AL1 to a third portion P3 of one adjacent second auxiliary line AL2.

As shown in FIG. 1, an end of each of the plurality of third auxiliary lines AL3 near the one first auxiliary line AL1 may terminate above the one first auxiliary line AL1 and is electrically connected to the one first auxiliary line AL1 through at least one conductive via C3, and an end of each of the plurality of third auxiliary lines AL3 near the one second auxiliary line AL2 may terminate above the one second auxiliary line AL2 and is electrically connected to the one second auxiliary line AL2 through at least one conductive via C2. In some embodiments, the plurality of third auxiliary lines AL3, the plurality of first scan lines SL1, and the plurality of second scan lines SL2 may belong to a same conductive layer, and each of the plurality of third auxiliary lines AL3 is, for example, between one first scan line SL1 and one second row R2, that is, the plurality of third auxiliary lines AL3 may not overlap with the plurality of first scan lines SL1 in a third direction D3 perpendicular to the first direction D1 and the second direction D2. In some other embodiments, the plurality of third auxiliary lines AL3 do not belong to the same conductive layer as a plurality of scan lines (including the plurality of first scan lines SL1 and the plurality of second scan lines SL2) nor as a plurality of data lines (including the plurality of first data lines DL1 and the plurality of second data lines DL2), and each of the plurality of third auxiliary lines AL3 may at least partially overlap with one first scan line SL1 in the third direction D3 and be electrically insulated from the one first scan line SL1.

FIG. 1 schematically illustrates that each of the plurality of first auxiliary lines AL1 is electrically connected to a corresponding second auxiliary line AL2 through one third auxiliary line AL3, and a number of first auxiliary lines AL1, a number of second auxiliary lines AL2, and a number of third auxiliary lines AL3 are the same. However, in other embodiments, each of the plurality of first auxiliary lines AL1 may be electrically connected to a corresponding second auxiliary line AL2 through one or more third auxiliary lines AL3. For example, a first portion P1 of each of the plurality of first auxiliary lines AL1 may be electrically connected to third portions P3 of the plurality of second auxiliary lines AL2 through one or a plurality of third auxiliary lines AL3. Alternatively, a third portion P3 of each of the plurality of second auxiliary lines AL2 may be electrically connected to first portions P1 of the plurality of first auxiliary lines AL1 through one or a plurality of third auxiliary lines AL3. A number of any of the first auxiliary line AL1, the second auxiliary line AL2, and the third auxiliary line AL3 is increased, thereby reducing impedance and improving uniformity of a display screen.

At least one of the plurality of fourth auxiliary lines AL4 is located in the array formed by the plurality of sub-pixels SP. For example, the at least one of the plurality of fourth auxiliary lines AL4 may be located between two adjacent first rows R1. The plurality of fourth auxiliary lines AL4 may be disposed in parallel with the plurality of first scan lines SL1 and the plurality of second scan lines SL2. For example, each of the plurality of fourth auxiliary lines AL4 may extend in the second direction D2, and each of the plurality of fourth auxiliary lines AL4 electrically connects one second scan line SL2 to one adjacent first scan line SL1.

As shown in FIG. 1, each of the plurality of fourth auxiliary lines AL4 may extend from one corresponding first scan line SL1 along the second direction D2 and end in one adjacent second scan line SL2. In some embodiments, the plurality of fourth auxiliary lines AL4, the plurality of first scan lines SL1, and the plurality of second scan lines SL2 may belong to a same conductive layer, and each of the plurality of fourth auxiliary lines AL4 is in contact with one electrically connected first scan line SL1 and one electrically connected second scan line SL2. Alternatively, the plurality of fourth auxiliary lines AL4 may not belong to the same conductive layer as the plurality of first scan lines SL1 and the plurality of second scan lines SL2, and each of the plurality of fourth auxiliary lines AL4 may be electrically connected to one corresponding first scan line SL1 and one corresponding second scan line SL2 through a plurality of conductive vias (not shown).

FIG. 1 schematically illustrates that each of the plurality of first scan lines SL1 is electrically connected to one corresponding second scan line SL2 through one fourth auxiliary line AL4. However, in other embodiments, each of the plurality of first scan lines SL1 may be electrically connected to more than one fourth auxiliary line AL4 through one corresponding second scan line SL2. A number of any of fourth auxiliary lines AL4 is increased, thereby reducing impedance and improving uniformity of a display screen.

In the designs in which the first auxiliary line AL1 is electrically connected to the first scan line SL1, the third auxiliary line AL3 electrically connects the first auxiliary line AL1 to the second auxiliary line AL2, and the fourth auxiliary line AL4 electrically connects the first scan line SL1 to the corresponding second scan line SL2, a scan signal has two transmission paths (including the first portion P1 of the first auxiliary line AL1 and the third portion P3 of the second auxiliary line AL2) before being transmitted to the third auxiliary line AL3, the two transmission paths are merged by the third auxiliary line AL3 into one transmission path (the first portion P1 between the third auxiliary line AL3 and the first scan line SL1 in the second direction D2), and the one transmission path is divided into two transmission paths (including the first scan line SL1 and the second scan line SL2) by the fourth auxiliary line AL4. In this way, two adjacent second rows R2 (such as the second row R2-1 and the second row R2-2) can receive scan signals at the same timing. Through the foregoing circuit design and signal input of the first data line DL1 and the second data line DL2 (data signals are sequentially output along the first direction D1 to the alternately disposed first data lines DL1 and second data lines DL2), a driving mode of two data lines and half gate line (2DHG) can be achieved.

For ease of description, a union of the second row R2-1 and the second row R2-2 is hereinafter referred to as a first unit, a union of the second row R2-3 and the second row R2-4 is hereinafter referred to as a second unit, and a union of the second row R2-5 and the second row R2-6 is hereinafter referred to as a third unit. The display panel 1 may include more units as required, and the units are sequentially arranged in the opposite direction of the second direction D2. In addition, first-order pre-charging means that a switching element (an active element SP1) in an $(i+1)^{th}$ unit is turned on before a switching element in an $i^{th}$ unit is turned off and a switching element in an $(i+2)^{th}$ unit is turned on only after the switching element in the $i^{th}$ unit is turned off, i being a positive integer. When i is equal to 1 and pre-charging is first-order, a switching element in the second unit is turned on before a switching element in the first unit is turned off, and a switching element in the third unit is turned on only after the switching element in the first unit is turned off. Second-order pre-charging means that the switching element in the $(i+1)^{th}$ unit and the switching element in the $(i+2)^{th}$ unit are sequentially turned on before the switching element in the $i^{th}$ unit is turned off (the switching element in the $(i+1)^{th}$ unit is turned on before the switching element in the $(i+2)^{th}$ unit), and a switching element in an $(i+3)^{th}$ unit is turned on after the switching element in the $i^{th}$ unit is turned off. When i is equal to 1 and pre-charging is second-order, the switching element in the second unit and the switching element in the third unit are sequentially turned on before the switching element in the first unit is turned off, and a switching element in a fourth unit (not shown in FIG. 1, such as a union of the second row R2-7 and the second row R2-8 in FIG. 2) is turned on after the switching element in the first unit is turned off. A case in which pre-charging is third-order or higher-order may be deduced by analogy.

When pre-charging is first-order, the switching element in the second unit is turned on before the switching element in the first unit is turned off. If an auxiliary line of a transmission signal (such as a scan signal) in the first unit passes through a plurality of sub-pixels SP in the second unit, for example, the auxiliary line of the first unit extends from a region between the plurality of sub-pixels SP to above the scan line corresponding to the first unit, electric potentials of the plurality of sub-pixels SP (such as electric potentials of a pixel electrode SP2) are pulled down when the switching element of the first unit is turned off. As a result, brightness of the plurality of sub-pixels SP is different from brightness of other sub-pixels SP in the second unit.

If the third auxiliary line AL3 and the fourth auxiliary line AL4 are not disposed, and the third portion P3 of the second auxiliary line AL2 extends to the second scan line SL2 and is electrically connected to the second scan line SL2 through a conductive via (that is, independently transmit a scan signal to the first scan line SL1 and the second scan line SL2 through the first portion P1 of the first auxiliary line AL1 and the third portion P3 of the second auxiliary line AL2, respectively), when pre-charging is first-order, because the first portion P1 electrically connected to the first auxiliary line AL1 of the first unit passes through the middle two sub-pixels SP of the second row R2-3 and the middle two sub-pixels SP of the second row R2-4 and the third portion P3 electrically connected to the second auxiliary line AL2 of the first unit passes through the right two sub-pixels SP of the second row R2-3 and the right two sub-pixels SP of the second row R2-4, brightness of the eight sub-pixels SP in the second unit is affected by capacitive coupling, and is different from brightness of the remaining four sub-pixels SP in the second unit.

In contrast, in the design in which the third auxiliary line AL3 and the fourth auxiliary line AL4 are disposed, and the third portion P3 of the second auxiliary line AL2 electrically connected to the $i^{th}$ unit (such as the first unit) does not pass through one or more sub-pixels SP in the $(i+1)^{th}$ unit (such as the second unit), a number of sub-pixels SP affected by capacitive coupling can be reduced when pre-charging is first-order, for example, the right two sub-pixels SP of the second row R2-3 and the right two sub-pixels SP of the second row R2-4 are prevented from being affected by capacitive coupling.

According to the above design, when pre-charging is n-order, there are at least n units between the third auxiliary line AL3 and the first scan line SL1 electrically connected thereto, that is, there are at least 2n second rows R2 between each of the plurality of third auxiliary lines AL3 and the first scan line SL1 electrically connected thereto, and there are at least 2n+1 second rows R2 between each of the plurality of third auxiliary lines AL3 and the second scan line SL2 electrically connected thereto, n being a positive integer. FIG. 1 schematically illustrates a circuit design with first-order pre-charging, where there are two second rows R2 between each of the plurality of third auxiliary lines AL3 and the first scan line SL1 electrically connected thereto, and there are at least three second rows R2 between each of the plurality of third auxiliary lines AL3 and the second scan line SL2 electrically connected thereto. However, in other embodiments, in the first-order pre-charging architecture, there may also be more than two (such as three, four or more) second rows R2 between each of the plurality of third auxiliary lines AL3 and the first scan line SL1 electrically connected thereto, and there may also be more than three (such as four, five, or more) second rows R2 between each of the plurality of third auxiliary lines AL3 and the second scan line SL2 electrically connected thereto.

In comparison with a green sub-pixel G, human eyes has lower perception of brightness (or gray-scale) variation of a red sub-pixel R or a blue sub-pixel B. Therefore, in some embodiments, at least one first auxiliary line AL1 passing through the second unit may be disposed between a red row and one adjacent blue row, thereby preventing the coupling effect from affecting green sub-pixels G of brightness (or gray-scale) variation that are easier for human eyes to perceive. In addition, because the third portion P3 of the second auxiliary line AL2 (a portion for transmitting a scan signal) does not pass through a sub-pixel SP in the second unit, at least one second auxiliary line AL2 may be disposed between a green row and one adjacent blue row, to prevent the green sub-pixel G from being affected by capacitive coupling by disposing. Alternatively, at least one second auxiliary line AL2 may be disposed between a green row and one adjacent red row, to prevent the green sub-pixel G from being affected by capacitive coupling. In addition, because two sub-pixels SP on both sides of the fourth auxiliary line AL4 in the first direction D1 may be affected by the coupling effect, at least one fourth auxiliary line AL4 may be disposed between one red row and one adjacent blue row, thereby preventing the coupling effect from affecting green sub-pixels G of gray-scale variation that are easier for human eyes to perceive.

In some embodiments, the second portion P2 of the first auxiliary line AL1 may overlap with at least one fourth auxiliary line AL4 in the third direction D3, and the second portion P2 is electrically insulated from the at least one fourth auxiliary line AL4. The second portion P2 of the first auxiliary line AL1 is disposed above at least one fourth auxiliary line AL4 in an overlapping manner, thereby providing a shielding effect and improving display quality.

In some embodiments, the plurality of fourth auxiliary lines AL4 may be arranged in a misaligned manner. The misaligned arrangement means that the plurality of fourth auxiliary lines AL4 may be irregularly distributed (referring to FIG. 3) in the array formed by the plurality of sub-pixels SP, and instead of being regularly distributed in the array formed by the plurality of sub-pixels SP. A moire pattern phenomenon caused by a periodic structure can be avoided through the design of misaligned arrangement, and the human eye's perception of gray-scale variation can be reduced.

According to different requirements, the display panel 1 may further include other elements or films. For example, the display panel 1 may further include a plurality of fifth auxiliary lines AL5. At least one of the plurality of fifth auxiliary lines AL5 is located in the array formed by the plurality of sub-pixels SP. For example, the at least one of the plurality of fifth auxiliary lines AL5 may be located between two adjacent first rows R1. The plurality of fifth auxiliary lines AL5 may be disposed in parallel with the plurality of first data lines DL1 and the plurality of second data lines DL2. In some embodiments, the plurality of fifth auxiliary lines AL5, the plurality of first data lines DL1, and the plurality of second data lines DL2 may belong to a same conductive layer, that is, the plurality of fifth auxiliary lines AL5 may be disposed on the same layer as the plurality of first data lines DL1 and the plurality of second data lines DL2.

Each of the plurality of fifth auxiliary lines AL5 may extend in the second direction D2. In some embodiments, the plurality of fifth auxiliary lines AL5 are, for example, connected to a direct current signal terminal, to provide a voltage stabilizing effect, but is not limited thereto. In some other embodiments, the plurality of fifth auxiliary lines AL5 can also be used as repair lines. In some still other embodiments, at least one fourth auxiliary line AL4 may overlap with at least one fifth auxiliary line AL5 in the third direction D3, and the at least one fourth auxiliary line AL4 is electrically insulated from the at least one fifth auxiliary line AL5. The fifth auxiliary line AL5 is disposed above at least one fourth auxiliary line AL4 in an overlapping manner, thereby providing a shielding effect and improving display quality.

The display panel 1 may further include a plurality of common electrode lines CL. At least one of the plurality of common electrode lines CL is located in the array formed by the plurality of sub-pixels SP. For example, the at least one of the plurality of common electrode lines CL may be located between two adjacent second rows R2. The plurality of common electrode lines CL may be disposed in parallel with the plurality of first scan lines SL1 and the plurality of second scan lines SL2. In some embodiments, the plurality of common electrode lines CL, the plurality of first scan lines SL1, and the plurality of second scan lines SL2 may belong to a same conductive layer, and each of the plurality of common electrode lines CL may be disposed on the same layer as the plurality of first scan lines SL1 and the plurality of second scan lines SL2.

Each of the plurality of common electrode lines CL extends, for example, in the first direction D1, and at least one of the plurality of common electrode lines CL is located between the first scan line SL1 and the second scan line SL2 electrically connected through the fourth auxiliary line AL4. If the plurality of common electrode lines CL, the plurality of fourth auxiliary lines AL4, the plurality of first scan lines SL1, and the plurality of second scan lines SL2 belong to a same conductive layer, at least one of the plurality of common electrode lines CL (such as a common electrode line CLA) includes a plurality of portions P arranged in the first direction D1, and the plurality of portions P are spaced apart by the plurality of fourth auxiliary lines AL4. In particular, two portions P located on opposite sides of each of the plurality of fourth auxiliary lines AL4 in the first direction D1 respectively keep a distance from the fourth auxiliary line AL4 to avoid a short circuit with the fourth auxiliary line AL4. In some embodiments, the display panel 1 may further include a plurality of connection lines (not shown in FIG. 1) to electrically connect the plurality of common electrode lines CL to the plurality of common electrode lines CLA.

For ease of description, FIG. 3 schematically illustrates the plurality of first scan lines SL1, the plurality of second scan lines SL2, the plurality of fourth auxiliary lines AL4, the plurality of common electrode lines CL, the plurality of common electrode lines CLA, and the plurality of connection lines CTL in the display panel, and the plurality of sub-pixels SP, the plurality of first data lines SL1, the plurality of second data lines SL2, the plurality of first auxiliary lines AL1, the plurality of second auxiliary lines AL2, and the plurality of third auxiliary lines AL3 in FIG. 1 are omitted in FIG. 3.

Referring to FIG. 3, each of the plurality of common electrode lines CLA includes, for example, two fifth portions P5 and at least one sixth portion P6 between the two fifth portions P5, the at least one sixth portion P6 being located between two adjacent fourth auxiliary lines AL4 in the first direction D1. FIG. 3 schematically illustrates that each of the plurality of common electrode lines CLA includes two fifth portions P5 and two sixth portions P6, but is not limited thereto. For example, a number of sixth portions P6 may increase as a number of fourth auxiliary lines AL4 increases, and a number of sixth portions P6 may decrease as the number of fourth auxiliary lines AL4 decreases. In FIG. 3, the fifth portion P5 and the sixth portion P6 are represented in different background colors to distinguish the fifth portion P5 and the sixth portion P6. However, the fifth portion P5 and the sixth portion P6 may belong to a same conductive layer or may be formed together, but is not limited thereto.

The plurality of connection lines CTL may include a connection line CTL1 and a connection line CTL2. For example, the connection line CTL1 and the connection line CTL2 are respectively located on opposite sides of the array formed by the plurality of sub-pixels (not shown in FIG. 3) in the first direction D1, and the plurality of common electrode lines CL and the plurality of fifth portions P5 may be electrically connected through the connection line CTL1 or the connection line CTL2 located at the edge. In some embodiments, the connection line CTL1 and the connection line CTL2 may be formed together with the common electrode line CL, the common electrode line CLA, the plurality of first scan lines SL1 and the plurality of second scan lines SL2, but this is not limited thereto. Alternatively, the connection line CTL1 and the connection line CTL2 may be formed together with the plurality of first data lines DL1 (referring to FIG. 1) and the plurality of second data lines DL2 (referring to FIG. 1), and the connection line CTL1 (or the connection line CTL2) is electrically connected to the corresponding common electrode line CL and common electrode line CLA through a conductive through hole (not shown).

In some embodiments, the plurality of connection lines CTL may further include at least one connection line CTL3. For example, the connection line CTL3 extends in the second direction D2, and electrically connects more than three sixth portions P6 in more than three common electrode lines CLA. In some embodiments, the connection line CTL3 may electrically connect all sixth portions P6 arranged in the second direction D2, but is not limited thereto. In some embodiments, the connection line CTL3 may be formed together with the plurality of first data lines DL1 (referring to FIG. 1) and the plurality of second data lines DL2 (referring to FIG. 1), and the connection line CTL3 is electrically connected to the corresponding common electrode line CL and common electrode line CLA through a conductive through hole C4.

In some embodiments, the plurality of connection lines CTL may further include a plurality of connection lines CTL4. For example, each of the plurality of connection lines CTL4 extends in the second direction D2, and electrically connects one common electrode line CL to one adjacent sixth portion P6, but is not limited thereto. In some embodiments, each of the plurality of connection lines CTL4 may electrically connect two adjacent sixth portions P6 in the second direction D2. In some embodiments, the plurality of connection lines CTL4 may be formed together with the plurality of first data lines DL1 (referring to FIG. 1) and the plurality of second data lines DL2 (referring to FIG. 1), and the connection line CTL4 is electrically connected to the corresponding common electrode line CLA or common electrode line CL through a conductive through hole C5.

Referring to FIG. 2, a main difference between a display panel 1A and the display panel 1 in FIG. 1 lies in that a design of an auxiliary circuit in the display panel 1A may be further applied to second-order pre-charging. In particular, in the display panel 1A, when pre-charging is second-order, there are at least four second rows R2 between each of the plurality of third auxiliary lines AL3 and the first scan line SL1 electrically connected thereto, and there are at least five second rows R2 between each of the plurality of third auxiliary lines AL3 and the second scan line SL2 electrically connected thereto. In FIG. 2, to clearly show a relative disposing relationship between two third auxiliary lines AL3 corresponding to the first unit (the union of the second row R2-1 and the second row R2-2) and the second unit (the union of the second row R2-3 and the second row R2-4) and other lines, FIG. 2 further shows a second row R2-7 and a second row R2-8. However, according to different requirements, the display panel 1A may further include more first rows R1 or more second rows R2. The circuit design applicable to third-order pre-charging or higher-order pre-charging may be deduced by analogy. Redundant descriptions are omitted herein.

In view of the above, in the embodiments of the invention, through the design of the first auxiliary line to the fourth auxiliary line, a number of sub-pixels affected by capacitive coupling can be reduced in the case of pre-charging. In some embodiments, at least one first auxiliary line may be disposed between a red row and one adjacent blue row, at least one second auxiliary line may be disposed between a green row and one adjacent blue row or red row, or at least one fourth auxiliary line may be disposed between one red row and one adjacent blue row, thereby preventing the coupling effect from affecting green sub-pixels of gray-scale variation that are easier for human eyes to perceive. In some embodiments, the first auxiliary line or the fifth auxiliary line may be disposed on at least one fourth auxiliary line in an overlapping manner, thereby providing a shielding effect and improving display quality. In some embodiments, a moire pattern phenomenon caused by a periodic structure can be avoided through the design of misaligned arrangement of the plurality of fourth auxiliary lines, and the human eye's perception of gray-scale variation can be reduced. In some embodiments, a number of any of the first auxiliary line, the second auxiliary line, the third auxiliary line, and the fourth auxiliary line can be increased, thereby reducing impedance and improving uniformity of a display screen.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A display panel, comprising:
   a plurality of sub-pixels, arranged into a plurality of first rows arranged in a first direction and a plurality of second rows arranged in a second direction intersecting the first direction;
   a plurality of first scan lines and a plurality of second scan lines, alternately arranged in the second direction and electrically connected to the plurality of second rows, respectively;
   a plurality of first data lines and a plurality of second data lines alternately arranged in the first direction, wherein there is a first data line and a second data line between any two adjacent first rows, and the plurality of second rows are alternately electrically connected to the plurality of first data lines and the plurality of second data lines;
   a plurality of first auxiliary lines, extending in the second direction, wherein each of the plurality of first auxiliary lines is electrically connected to a corresponding first scan line;
   a plurality of second auxiliary lines, extending in the second direction, wherein there is at least one first row between each of the plurality of first auxiliary lines and an adjacent second auxiliary line;
   a plurality of third auxiliary lines, wherein each of the plurality of third auxiliary lines electrically connects a first auxiliary line to an adjacent second auxiliary line; and
   a plurality of fourth auxiliary lines, wherein each of the plurality of fourth auxiliary lines electrically connects a second scan line to an adjacent first scan line, wherein there are at least 2n second rows between each of the plurality of third auxiliary lines and the first scan line electrically connected thereto, there are at least 2n+1 second rows between each of the plurality of third auxiliary lines and the second scan line electrically connected thereto, and n is a positive integer.

2. The display panel according to claim 1, wherein each of the plurality of first auxiliary lines comprises a first portion and the first portion is electrically connected to a first scan line, wherein an end of the first portion near the first scan line ends above the first scan line and is electrically connected to the first scan line through at least one conductive via.

3. The display panel according to claim 2, wherein each of the plurality of first auxiliary lines further comprises a second portion, the first portion and the second portion are arranged in the second direction, and the second portion is spaced apart from the first portion and is electrically insulated from the first portion, wherein the second portion extends from the end near the first portion along the second direction away from the first portion.

4. The display panel according to claim 3, wherein the first portion is connected to a gate signal terminal, and the second portion is connected to a direct current signal terminal.

5. The display panel according to claim 3, wherein the second portion overlaps with at least one fourth auxiliary line in a third direction perpendicular to the first direction and the second direction, and the second portion is electrically insulated from the at least one fourth auxiliary line.

6. The display panel according to claim 1, wherein the plurality of first auxiliary lines, the plurality of second auxiliary lines, the plurality of first data lines, and the plurality of second data lines belong to a same conductive layer.

7. The display panel according to claim 1, wherein each of the plurality of second auxiliary lines comprises a third portion and the third portion is electrically connected to a third auxiliary line, wherein an end of the third portion near the third auxiliary line ends above the third auxiliary line and is electrically connected to the third auxiliary line through at least one conductive via.

8. The display panel according to claim 7, wherein each of the plurality of second auxiliary lines further comprises a fourth portion, the third portion and the fourth portion are arranged in the second direction, and the fourth portion is spaced apart from the third portion and is electrically insulated from the third portion, wherein the fourth portion extends from the end near the third portion along the second direction away from the third portion.

9. The display panel according to claim 8, wherein the third portion is connected to a gate signal terminal, and the fourth portion is connected to a direct current signal terminal.

10. The display panel according to claim 1, wherein each of the plurality of third auxiliary lines extends in the first direction.

11. The display panel according to claim 1, wherein each of the plurality of third auxiliary lines is electrically connected to a corresponding first auxiliary line through at least one conductive via, and each of the plurality of third auxiliary lines is electrically connected to a corresponding second auxiliary line through at least another conductive via.

12. The display panel according to claim 1, wherein the plurality of third auxiliary lines, the plurality of first scan lines, and the plurality of second scan lines belong to a same conductive layer, and each of the plurality of third auxiliary lines is located between a first scan line and a second row.

13. The display panel according to claim 1, wherein each of the plurality of third auxiliary lines at least partially overlaps with a first scan line in a third direction perpendicular to the first direction and the second direction, and is electrically insulated from the first scan line.

14. The display panel according to claim 1, wherein the plurality of sub-pixels comprise a plurality of red sub-pixels, a plurality of green sub-pixels, and a plurality of blue sub-pixels, the plurality of red sub-pixels are arranged into a plurality of red rows arranged in the first direction, the plurality of green sub-pixels are arranged into a plurality of green rows arranged in the first direction, the plurality of blue sub-pixels are arranged into a plurality of blue rows arranged in the first direction, and the plurality of red rows, the plurality of green rows, and the plurality of blue rows are alternately arranged in the first direction, wherein at least one of the plurality of first auxiliary lines is located between a red row and an adjacent blue row.

15. The display panel according to claim 14, wherein at least one of the plurality of second auxiliary lines is located between a green row and an adjacent blue row or red row.

16. The display panel according to claim 14, wherein at least one of the plurality of fourth auxiliary lines is located between a red row and an adjacent blue row.

17. The display panel according to claim 1, wherein the plurality of fourth auxiliary lines are arranged in a misaligned manner.

18. The display panel according to claim 1, further comprising:
a plurality of fifth auxiliary lines, extending in the second direction, wherein each of the plurality of fifth auxiliary lines is located between two adjacent first rows and is connected to a direct current signal terminal.

19. The display panel according to claim 1, further comprising:
a plurality of common electrode lines, wherein each of the plurality of common electrode lines extends in the first direction and is located between two adjacent second rows, at least one of the plurality of common electrode lines comprises a plurality of portions arranged in the first direction, the plurality of portions are spaced apart by the plurality of fourth auxiliary lines, the plurality of portions comprise two fifth portions and at least a sixth portion located between the two fifth portions, and the at least one sixth portion is located between two adjacent fourth auxiliary lines in the first direction; and
a plurality of connection lines, electrically connecting the plurality of common electrode lines.

20. The display panel according to claim 19, wherein at least one of the plurality of connection lines electrically connects more than three sixth portions in more than three common electrode lines.

* * * * *